US009130796B2

(12) United States Patent
Krishnan et al.

(10) Patent No.: US 9,130,796 B2
(45) Date of Patent: *Sep. 8, 2015

(54) METHOD AND APPARATUS FOR CHARACTERIZED PRE-DISTORTION CALIBRATION OF A POWER AMPLIFIER

(71) Applicant: QUALCOMM Incorporated, San Diego, CA (US)

(72) Inventors: Sudarsan Krishnan, San Diego, CA (US); David Coronel, San Diego, CA (US); Jay P. Shah, Sunnyvale, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/793,994

(22) Filed: Mar. 11, 2013

(65) Prior Publication Data
US 2014/0023128 A1 Jan. 23, 2014

Related U.S. Application Data

(60) Provisional application No. 61/672,594, filed on Jul. 17, 2012.

(51) Int. Cl.
H04B 3/46 (2006.01)
H04L 25/49 (2006.01)
H04L 25/03 (2006.01)
H03F 1/32 (2006.01)
H04B 1/04 (2006.01)

(52) U.S. Cl.
CPC ........ H04L 25/03343 (2013.01); H03F 1/3282 (2013.01); H04B 1/0475 (2013.01); H04B 2001/0425 (2013.01)

(58) Field of Classification Search
CPC ................ H04L 27/367; H04L 27/368; H04B 2001/0425; H04B 1/0475; H04B 17/0005; H04B 17/001; H04B 17/0062; H04B 15/00
USPC ............... 375/224, 296–297; 455/501, 67.13, 455/67.14, 114.2, 114.3, 115.2
See application file for complete search history.

(56) References Cited

U.S. PATENT DOCUMENTS

| 7,113,036 | B2 | 9/2006 | Moffatt et al. |
| 8,009,762 | B1 | 8/2011 | Al-Qaq et al. |
| 8,081,711 | B2 | 12/2011 | Lee et al. |
| 8,170,507 | B2 | 5/2012 | Wang et al. |
| 8,170,819 | B2 | 5/2012 | Raghavan et al. |
| 8,354,884 | B2 * | 1/2013 | Braithwaite .................. 330/149 |
| 8,615,208 | B2 * | 12/2013 | McCallister et al. ...... 455/127.1 |

(Continued)

FOREIGN PATENT DOCUMENTS

EP 1394954 A2 3/2004

OTHER PUBLICATIONS

Partial International Search Report—PCT/US2013/050953—ISA/EPO—Jan. 23, 2014.

Primary Examiner — Khanh C Tran

(57) ABSTRACT

A method and apparatus for characterized pre-distortion calibration is provided. The method begins with the selection of a number of devices to be characterized. The number of devices selected may be a subset of a larger group of devices. The selected number of devices is then characterized. The method avoids characterizing the large group of devices. The calibration of the group of devices is then based on the characterization of the selected number of devices.

16 Claims, 8 Drawing Sheets

(56) References Cited

U.S. PATENT DOCUMENTS

| | | |
|---|---|---|
| 2005/0156662 A1 | 7/2005 | Raghupathy et al. |
| 2008/0051042 A1* | 2/2008 | Komaili et al. ............ 455/114.3 |
| 2008/0151974 A1 | 6/2008 | Jensen et al. |
| 2008/0238544 A1 | 10/2008 | Morris et al. |
| 2010/0128764 A1 | 5/2010 | Debaillie et al. |
| 2013/0287076 A1* | 10/2013 | Afsahi et al. .................. 375/221 |

* cited by examiner

METHOD AND APPARATUS FOR CHARACTERIZED PRE-DISTORTION CALIBRATION OF A POWER AMPLIFIER

CLAIM OF PRIORITY UNDER 35 U.S.C. §119

The present application for patent claims priority to Provisional Application No. 61/672,594 entitled "METHOD AND APPARATUS FOR CHARACTERIZED PRE-DISTORTION CALIBRATION OF A POWER AMPLIFIER" filed Jul. 17, 2012, and assigned to the assignee hereof and hereby expressly incorporated by reference herein.

BACKGROUND

1. Field

The present disclosure relates generally to wireless communication system. More specifically the present disclosure related to methods and apparatus for characterized pre-distortion calibration of a power amplifier.

2. Background

Wireless communication devices have become smaller and more powerful as well as more capable. Increasingly users rely on wireless communication devices for mobile phone use as well as email and Internet access. At the same time, devices have become smaller in size. Devices such as cellular telephones, personal digital assistants (PDAs), laptop computers, and other similar devices provide reliable service with expanded coverage areas. Such devices may be referred to as mobile stations, stations, access terminals, user terminals, subscriber units, user equipments, and similar terms.

A wireless communication system may support communication for multiple wireless communication devices at the same time. In use, a wireless communication device may communicate with one or more base stations by transmissions on the uplink and downlink. Base stations may be referred to as access points, Node Bs, or other similar terms. The uplink or reverse link refers to the communication link from the wireless communication device to the base station, while the downlink or forward link refers to the communication from the base station to the wireless communication devices.

Wireless communication systems may be multiple access systems capable of supporting communication with multiple users by sharing the available system resources, such as bandwidth and transmit power. Examples of such multiple access systems include code division multiple access (CDMA) systems, time division multiple access (TDMA) systems, frequency division multiple access (FDMA) systems, wideband code division multiple access (WCDMA) systems, global system for mobile (GSM) communication systems, enhanced data rates for GSM evolution (EDGE) systems, and orthogonal frequency division multiple access (OFDMA) systems.

As use of mobile devices grows, so does the need to manufacture and test new devices in an efficient manner. Linear power amplifiers, such as those used for EDGE mode, require careful pre-distortion calibration in order to operate the power amplifier. These tests demand significant time at the factory for the calibration process. Typically, such calibration and testing requires measurement of multiple values throughout the testing process. These tests require significant amounts of time to conduct. In some cases, operating values are selected which may be less than optimum but which require less testing time to determine may be used. In these cases, operating values such as EDGE mode current are less than optimum.

There is a need in the art for methods and apparatus for characterizing pre-distortion in the calibration process with reduced number of measurements needed to determine device calibration.

SUMMARY

Embodiments disclosed herein provide a method for characterized pre-distortion calibration. The method begins with the selection of a number of devices to be characterized. The number of devices selected may be a subset of a larger group of devices. The selected number of devices are then characterized. The calibration of the group of devices is then based on the characterization of the selected number of devices.

A further embodiment provides an apparatus for characterized pre-distortion calibration. The apparatus includes a processor for performing pre-distortion calibration, a processor for averaging curves for each RF gain index on each channel, and a non-volatile memory.

A still further embodiment provides an apparatus for characterized pre-distortion calibration. The apparatus includes means for selecting a number of devices for characterizing, wherein the number of devices selected is a subset of a group of devices; means for characterizing the selected number of devices; and means for calibrating the group of devices based on the characterization of the selected number of devices.

An additional embodiment provides a computer-readable non-transitory storage medium containing instructions. The instructions cause a processor to perform the steps of: selecting a number of devices for characterizing, wherein the number of devices selected is a subset of a larger group of devices; characterizing the selected number of devices; and calibrating the group of devices based on the characterization of the selected number of devices.

DETAILED DESCRIPTION

Figure 1:
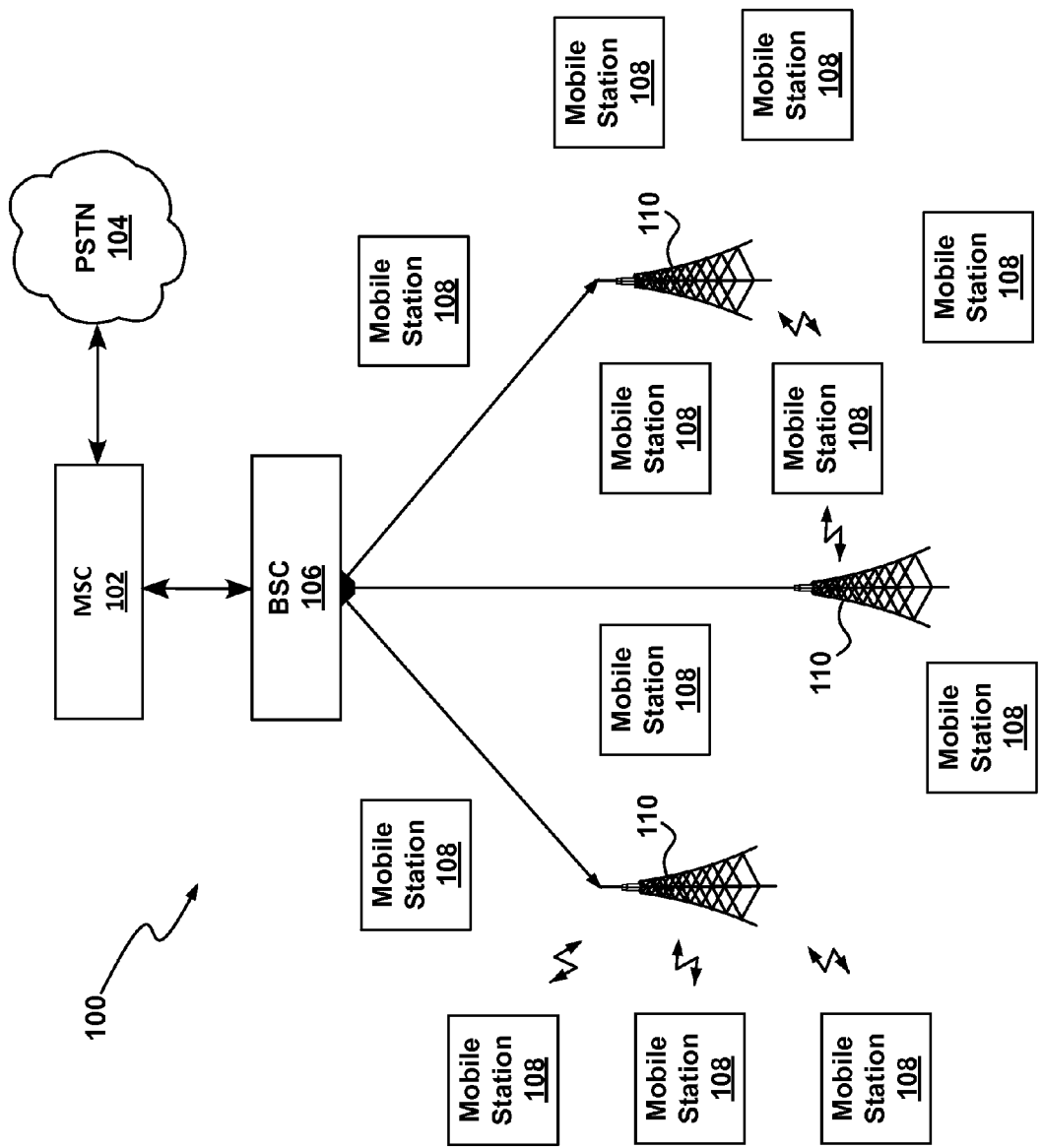
FIG. 1 illustrates one configuration of a wireless communication system, in accordance with certain embodiments of the disclosure.

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

As used in this application, the terms "component," "module," "system" and the like are intended to include a computer-related entity, such as, but not limited to hardware, firmware, a combination of hardware and software, software, or software in execution. For example, a component may be, but is not limited to being, a process running on a processor, a processor, an object, an executable, a thread of execution, a program and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

As used herein, the term "determining" encompasses a wide variety of actions and therefore, "determining" can include calculating, computing, processing, deriving, investigating, looking up (e.g., looking up in a table, a database or another data structure), ascertaining and the like. Also, "determining" can include resolving, selecting choosing, establishing, and the like.

The phrase "based on" does not mean "based only on," unless expressly specified otherwise. In other words, the phrase "based on" describes both "based only on" and "based at least on."

Moreover, the term "or" is intended to man an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

The various illustrative logical blocks, modules, and circuits described in connection with the present disclosure may be implemented or performed with a general purpose processor, a digital signal processor (DSP), an application specific integrated circuit (ASIC), a field programmable gate array (FPGA), or other programmable logic device, discrete gate or transistor logic, discrete hardware components or any combination thereof designed to perform the functions described herein. A general purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core or any other such configuration.

The steps of a method or algorithm described in connection with the present disclosure may be embodied directly in hardware, in a software module executed by a processor or in a combination of the two. A software module may reside in any form of storage medium that is known in the art. Some examples of storage media that may be used include RAM memory, flash memory, ROM memory, EPROM memory, EEPROM memory, registers, a hard disk, a removable disk, a CD-ROM, and so forth. A software module may comprise a single instruction, or many instructions, and may be distributed over several different code segments, among different programs and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in software, the functions may be stored as one or more instructions on a computer-readable medium. A computer-readable medium may be any available medium that can be accessed by a computer. By way of example, and not limitation, a computer-readable medium may comprise RAM, ROM, EEPROM, CD-ROM or other optical disk storage, magnetic disk storage, or other magnetic storage devices, or any other medium that can be used to carry or store desired program code in the form of instructions or data structures and that can be accessed by a computer. Disk and disc, as used herein, includes compact disk (CD), laser disk, optical disc, digital versatile disk (DVD), floppy disk, and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

Further, it should be appreciated that modules and/or other appropriate means for performing the methods and techniques described herein, such as those illustrated by FIGS. 3-6, can be downloaded and/or otherwise obtained by a mobile device and/or base station as applicable. For example, such a device can be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a mobile device and/or base station can obtain the various methods upon coupling or providing the storage means to the device. Moreover, any other suitable technique for providing the methods and techniques described herein to a device can be utilized.

Furthermore, various aspects are described herein in connection with a terminal, which can be a wired terminal or a wireless terminal. A terminal can also be called a system, device, subscriber unit, subscriber station, mobile station, mobile, mobile device, remote station, remote terminal, access terminal, user terminal, communication device, user agent, user device, or user equipment (UE). A wireless terminal may be a cellular telephone, a satellite phone, a cordless telephone, a Session Initiation Protocol (SIP) phone, a wireless local loop (WLL) station, a personal digital assistant (PDA), a handheld device having wireless connection capability, a computing device, or other processing devices connected to a wireless modem. Moreover, various aspects are described herein in connection with a base station. A base station may be utilized for communicating with wireless terminal(s) and may also be referred to as an access point, a Node B, or some other terminology.

The techniques described herein may be used for various wireless communication networks such as Code Division Multiple Access (CDMA) networks, Time Division Multiple Access (TDMA) networks, Frequency Division Multiple Access (FDMA) networks, Orthogonal FDMA (OFDMA) networks, Single-Carrier FDMA (SC-FDMA) networks, etc. The terms "networks" and "systems" are often used interchangeably. A CDMA network may implement a radio technology such as Universal Terrestrial Radio Access (UTRA), CDMA2000, etc. UTRA includes Wideband CDMA (W-CDMA). CDMA2000 covers IS-2000, IS-95 and technology such as Global System for Mobile Communication (GSM).

An OFDMA network may implement a radio technology such as Evolved UTRA (E-UTRA), the Institute of Electrical and Electronics Engineers (IEEE) 802.11, IEEE 802.16, IEEE 802.20, Flash-OFDAM®, etc. UTRA, E-UTRA, and GSM are part of Universal Mobile Telecommunication System (UMTS). Long Term Evolution (LTE) is a release of UMTS that uses E-UTRA. UTRA, E-UTRA, GSM, UMTS, and LTE are described in documents from an organization named "$3^{rd}$ Generation Partnership Project" (3GPP). CDMA2000 is described in documents from an organization named "$3^{rd}$ Generation Partnership Project 2" (3GPP2). These various radio technologies and standards are known in the art. For clarity, certain aspects of the techniques are described below for LTE, and LTE terminology is used in much of the description below. It should be noted that the LTE terminology is used by way of illustration and the scope of the disclosure is not limited to LTE. Rather, the techniques described herein may be utilized in various application involving wireless transmissions, such as personal area networks (PANs), body area networks (BANs), location, Bluetooth, GPS, UWB, RFID, and the like. Further, the techniques may also be utilized in wired systems, such as cable modems, fiber-based systems, and the like.

Single carrier frequency division multiple access (SC-FDMA), which utilizes single carrier modulation and frequency domain equalization has similar performance and essentially the same overall complexity as those of an OFDMA system. SC-FDMA signal may have lower peak-to-average power ration (PAPR) because of its inherent single carrier structure. SC-FDMA may be used in the uplink communications where the lower PAPR greatly benefits the mobile terminal in terms of transmit power efficiency.

Amplifiers may have a linear range and a non-linear range. In order to avoid signal distortion, amplifiers may be used in the linear range. In the non-linear range, the signals may be subject to distortion due to amplitude to amplitude modulation and amplitude to phase modulation. This may be caused by the ratio of input power to output power may not be constant when the amplifier is operated in the non-linear range. As the input signal amplitude increases, a disproportionate increase in the output power may occur. This may be referred to as amplitude modulation to amplitude modulation (AMAM), since an unwanted additional amplitude modulation is experienced.

AMAM may be experienced up to a maximum output power at which point the input values may result in the same output values. When this occurs it may be known as compression, and may result in the signal being clipped. The signal may have square or sharp edges in the time domain, which implies that higher frequency components may be generated. This may cause out of band emissions in addition to the distortion of the amplified signal.

The output phase of the signal may not be constant at different amplitude levels of the input signal undergoing amplification. The amplified signal may experience a phase modulation as a function of the input amplitude. This relationship may not be constant, that is, the relationship may be non-linear. This may be referred to amplitude modulation to phase modulation (AMPM).

A power amplifier may be driver harder in order to obtain more efficiency from the power amplifier. Typically, operating a power amplifier at a higher efficiency comes at a price of amplitude and phase distortion of the input signal. Pre-distortion techniques may be used to correct these distortions. However, the power amplifier may have a memory effect. This memory effect means that the actual observed distortion depends on the nature of the waveform to be transmitted. This means that the AMAM or AMPM characteristics of the power amplifier may depend on the nature of the waveform of the input signal. It is desirable to measure the AMAM and AMPM characteristics of the power amplifier when a transmitter transmits a waveform similar to an actual transmit waveform. This testing is usually done during the manufacturing or assembly of the transmitter that includes the power amplifier. The power amplifier may amplify signals for GSM communication systems, EDGE systems, WCDMA systems, among others.

During testing the measured mean AMAM and AMPM characteristics of the power amplifier may be used to pre-distort the transmit waveform. The power amplifier may also be calibrated using an actual transmit signal, which enables pre-distortion techniques to be used. These pre-distortion techniques may vary depending on the system where the power amplifier will ultimately be used. Each system may have different specifications for the power amplifiers used on that system. By using an actual transmit signal to calibrate the power amplifier the same power amplifier may be used for each type of communication system.

FIG. 1 illustrates a wireless system 100 that may include a plurality of mobile stations 108, a plurality of base stations 110, a base station controller (BSC) 106, and a mobile switching center (MSC) 102. The system 100 may be GSM, EDGE, WCDMA, CDMA, etc. the MSC 102 may be configured to interface with a public switched telephone network (PTSN) 104. The MSC may also be configured to interface with the BSC 106. There may be more than one BSC 106 in the system 100. Each base station 110 may include at least one sector (not shown), where each sector may have an omnidirectional antenna or an antenna pointed in a particular direction radially away from the base stations 110. Alternatively, each sector may include two antennas for diversity reception. Each base station 110 may be designed to support a plurality of frequency assignments. The intersection of a sector and a frequency assignment may be referred to as a channel. The mobile stations 108 may include cellular or portable communication system (PCS) telephones.

During operation of the cellular telephone system 100, the base stations 110 may receive sets of reverse link signals from sets of mobile stations 108. The mobile stations 108 may be involved in telephone calls or other communications. Each reverse link signal received by a given base station 110 may be processed within that base station 110. The resulting data may be forwarded to the BSC 106. The BSC 106 may provide call resource allocation and mobility management functionality including the orchestration of soft handoffs between base stations 110. The BSC 106 may also route the received data to the MSC 102, which provides additional routing services for interfacing with the PSTN 104. Similarly, the PTSN 104 may interface with the MSC 102, and the MSC 012 may interface with the BSC 106, which in turn may control the base stations 110 to transmit sets of forward link signals to sets of mobile stations 108.

Figure 2:
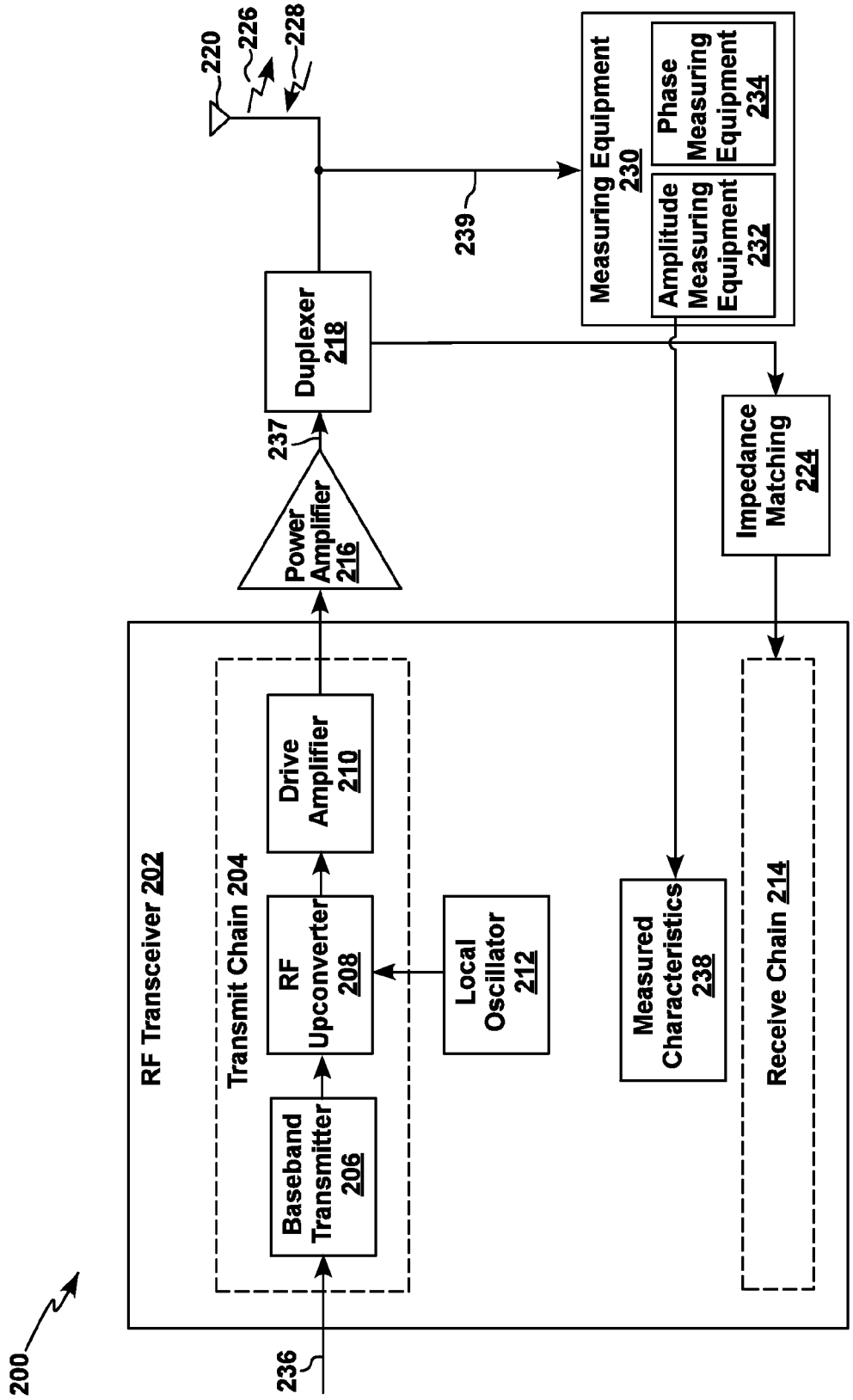
FIG. 2 illustrates a block diagram of an example of electronic components capable of transmitting in accordance with certain embodiments of the disclosure.

FIG. 2 is a block diagram illustrating one example of electronic components 200 capable of transmitting. The electronic components 200 may be part of a mobile station 108, a base station 110, or any other type of device that may transmit. The electronic components 200 may include a power amplifier 216. Tests may be conducted in order to optimize the performance and efficiency of the amplifier 216. In one scenario the tests may be conducted before the components 200 are marketed, that is, before an end user acquires the components 200. In one example, the configuration 200 may include a radio frequency (RF) transceiver 202. The transceiver 202 may transmit outgoing signals 226 and receive incoming signals 228 via an antenna 220. A transmit chain 204 may be used to process signals that are to be transmitted and a receive chain 214 may be implemented to process signals received by the transceiver 202. An incoming signal 228 may be processed by a duplexer 218 and impedance matching 224 of the incoming signal 228 may occur. The incoming signal 228 may then be processed by the receive chain 214.

In one configuration, the system 200 is tested in order to calibrate the power amplifier (PA) 216 and to optimize the efficiency of PA 216. A testing input signal 236 may be provided to a baseband transmitter 206. The baseband transmitter 206 may also include a filter (not shown) to filter out noise associated with the testing input signal 236. The testing input signal 236 may be upconverted to a high frequency signal by an RF upconverter 208. The upconverter 208 may be under the control of a local oscillator 212. A driver amplifier 210 may amplify the signal and the signal may pass through the PA 216.

Figure 8:
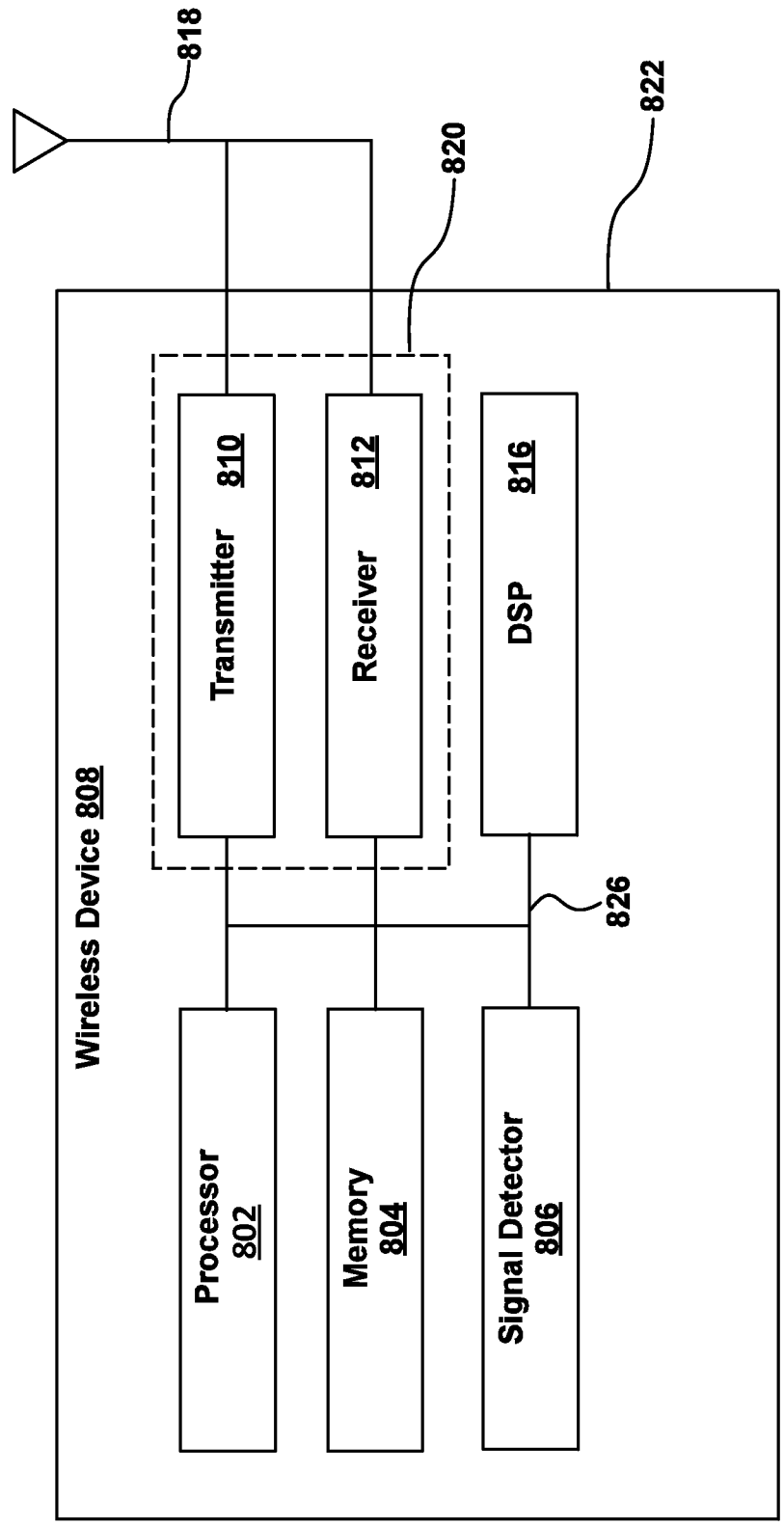
FIG. 8 illustrates components of a wireless device according to embodiments of the disclosure.
Figure 9:
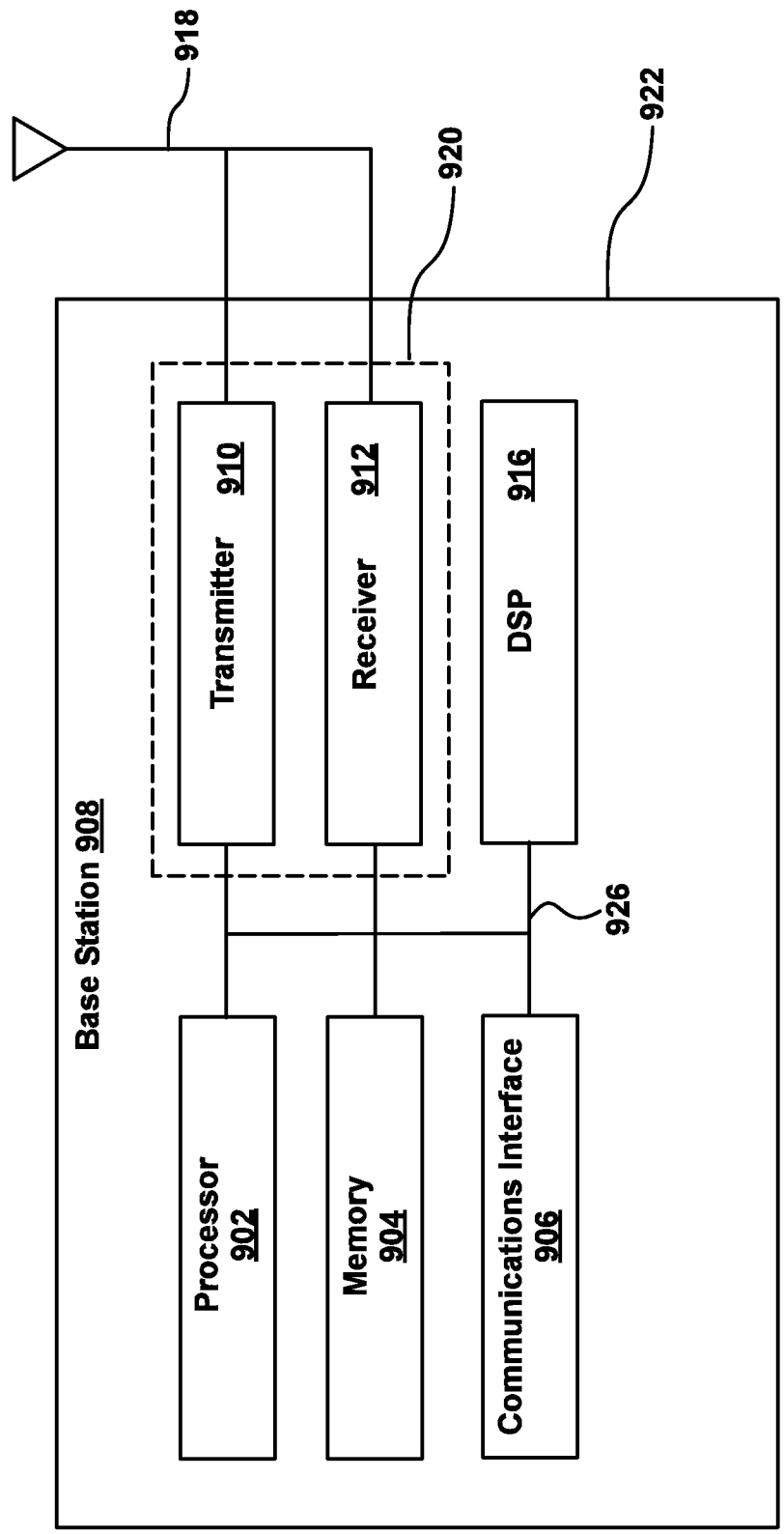
FIG. 9 depicts various components that may be utilized in a wireless communication device.

In one configuration, the testing input signal 236 may be fed through the transmit chain 204, into the PA 216, and PA output 237 may be passed through a duplexer 218. The duplexed signal 239 may be measured (rather than measuring the output signal 226 from the antenna 220). During the testing of PA 216, measuring equipment 230 may be connected to the output of the duplexer 218 (i.e., the duplexed signal 239). The equipment 230 may include amplitude measuring equipment or functionality 232 and phase measuring equipment or functionality 234. The measuring equipment 230 may be implemented by a computing device that includes a processor, memory, a display, communication interfaces, and the like. The block diagrams of FIGS. 8 and 9 illustrate these components in the context of a wireless device and a base station.

The measuring equipment 230 may implement the amplitude measuring functionality and the phase measuring functionality to measure the mean AMAM/AMPM characteristics of the PA output 237 after it has passed through the duplexer 218 (i.e., the duplexed signal 239). The measured characteristics 238 (e.g., mean AMAM/AMPM characteristics) may be used to implement pre-distortion techniques in the baseband transmitter 206 when the system 200 is in normal use (see FIG. 8). For example, if the components 200 were part of a mobile station 108, the pre-distortion techniques may be used in the baseband transmitter 206 during normal operation of the mobile station 108.

A method is provided that reduces calibration time by characterizing a set of phones and applying a characterized pre-distortion calibration to every phone. Specifically, this requires that the AMAM maximum power, which defines the mapping between the output power and the baseband digital to analog converter (DAC), be adapted for each UE. In addition, a slope measurement of the AMAM slope correction may be adapted for each UE. The averaging technique should be specified for both AMAM and AMPM. A first technique for averaging averages power with respect to DAC and also to average phase distortion with respect to DAC. These techniques may be expanded to become a family of curves based on the RGI.

Linear power amplifiers may be used in 8 phase shift keyed (8PSK) mode of communication. This mode requires that pre-distortion calibration be performed to ensure that lees current is consumed when operating in 8PSK mode. This pre-distortion calibration requires an additional eight seconds per band. This additional time results in additional cost.

The methods described below use average AMAM values across a product group of UEs. Some additional measurements are added during DA calibration. These additional measurements are made to ensure that DAC output is nearly equal to the maximum DAC of the characterized data.

DA calibration offers a choice of options: PA, RGI, and Mode (GSM/EDGE). The ideal method would allow specifying a Maximum DAC for every curve and be able to set this from the factory test mode (FTM) software. It may be possible to implement this functionality internally through a combination of PA_SCALE and ENV_Gain. Such functionality would allow making one measurement for RGIs around the possible range of pre-distortion calibration RGIs. A drawback to this approach is that this may impose additional requirements on the software of the UE.

An embodiment described below provides the ability to make additional measurements during DA calibration. In operation, the method proceeds in two phases, a characterization phase and a calibration phase. In the characterization phase pre-distortion AMAM/AMPM curves are characterized across parts. A given DAC that is close to maximum DAC on all bands may only be set as a function of the envelope gain. This envelope gain becomes an envelope similar to GSM/EDGE digital gain envelopes.

In the calibration phase the UE supports a DA calibration command. The command includes an enumerated value for Mode (EDGE_PD_Mode). When EDGE_PD_Mode is selected the envelope gain that is stored in non-volatile memory for the set of UEs is used to obtain a DAC close to the maximum DAC. During DA calibration additional segments are added around the pre-distortion calibration RGI and are measured in the EDGE_PD_Mode.

The characterized AMAM/AMPM curves are applied to every UE. Once the pre-distortion RGI has been selected, the power difference between the EDGE_PD_Power for that RGI is computed and the characterized power difference is applied to the characterized AMAM maximum power.

Figure 3:
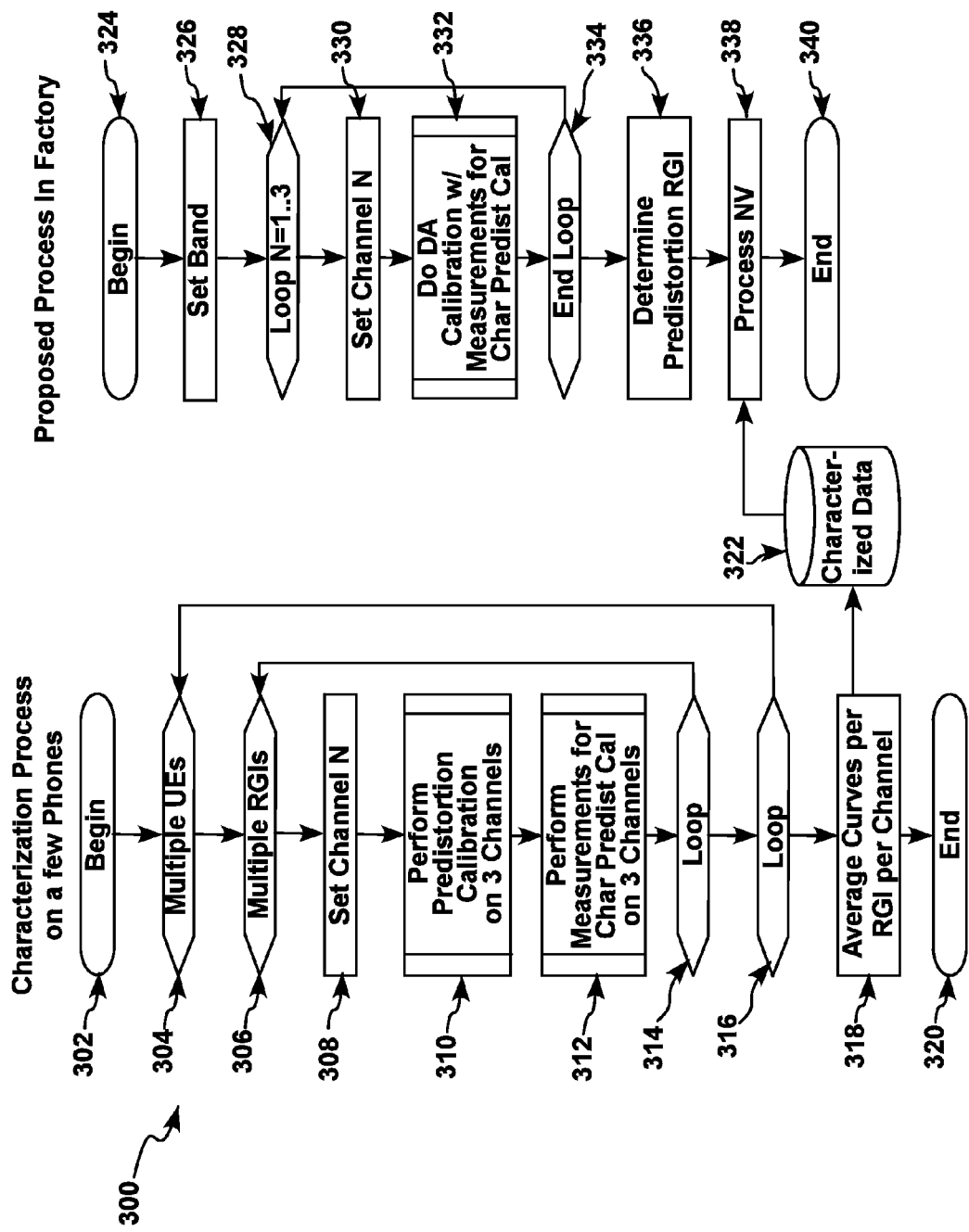
FIG. 3 is a flow diagram of a method for characterized pre-distortion calibration according to an embodiment.

FIG. 3 illustrates the method steps of a method of performing characterized pre-distortion calibration. The method is performed in two phases, a first phase consisting of steps 302 through 320 that performs a characterization proves on a selected few UEs and a second process, consisting of steps 324 through 340 that is performed on the all the UEs in that factory prior to delivery.

The process 300, begins at step 302. In step 304 multiple UEs are selected to undergo the characterization process. The number of UEs selected for the characterization process may vary and should be carefully selected to provide the needed data points. For example, if a new model of UE is being tested, it may be desirable to select more UEs for characterization than if a current model phone is in production and the design is well known.

Once the multiple UEs have been selected, multiple reserve guard intervals (RGI) are selected. The RGI may be used with the optical cable OFDM transmissions and should be selected carefully. Various desired operating characteristics may influence the selection of the RGI. As part of step 306, multiple RGIs may be selected. In step 308 the channel to be tested, channel n, is set.

In step 310 pre-distortion calibration is performed on three channels. Once the pre-distortion calibration is performed, measurements for characterization prediction calibration are performed on the three selected channels in step 312. In step 314 this process is repeated for each selected RGI. In step 316 the process is repeated for each UE.

Once the necessary measurements have been made, the average curves for each RGI are computed for each channel. The characterization curves are stored with other characterized data in step 322. The data stored in step 322 is also made available for the factory process, as discussed further below.

The factory process that most UEs undergo begins at step 324. In step 326 a band for testing is set. The number of loop passes through the process is determined and set in step 328. The loop channel n is set in step 330. The digital amplifier (DA) calibration with the measurements obtained from the characterized pre-distortion calibration is performed in step 332 for each DA. The process continues through the selected number of loops. The loop process ends at step 334. In step 338 the envelope gain is process with input from the characterized data collected earlier during the characterization process at step 322 is input and the calibration process concludes at step 340.

The method provides a characterization technique for AMAM/AMPM with binning on an RGI basis, as the RGIs provide a means to separate amplifiers for specific calibration and processing. The method also provides maximum power adaptation for every UE and also provides AMAM slope adaptation for every UE.

The method may also implement slope correction to calibrate out the average AMAM slope in addition to the AMAM maximum power. This is done by measuring AMAM slope during characterization between the different envelope gains. The envelope gain settings are repeated during digital amplifier calibration. At that point the slope is determined and corrected if needed. A further embodiment provides for performing AMPM slope compensation in the same manner.

The envelope gain settings are stored in a non-volatile memory for use during both the characterization process and the factory process. The envelope gain settings that are stored in the non-volatile memory correspond to the DACs used during characterization. If the AMPM slope correction is needed a reference phase envelope gain value is stored in the non-volatile memory. As testing continues, the array of envelope gain values continue to be stored in the non-volatile memory.

The DA calibration waveform may be extended to include additional mode settings. Multiple EDGE modes may b added as part of the extension. These additional EDGE modes are similar to the EDGE mode and differ in the envelope gain used.

When a power amplifier is driven to saturation both RF transceiver (RTR) and PA gain vary across parts, and as a result is not equal for every mobile device. It would be inaccurate to apply the same amount of pre-distortion to the baseband of every mobile unit. An embodiment described herein provides for a generic AMAM and AMPM curve as a function of power output (POUT) is created and a single measurement is made to map a given peak DAC value to a peak POUT value. Once the peak POUT for the individual device is known, the correct amount of pre-distortion may be extracted from the generic AMAM and AMPM curves.

Figure 4:
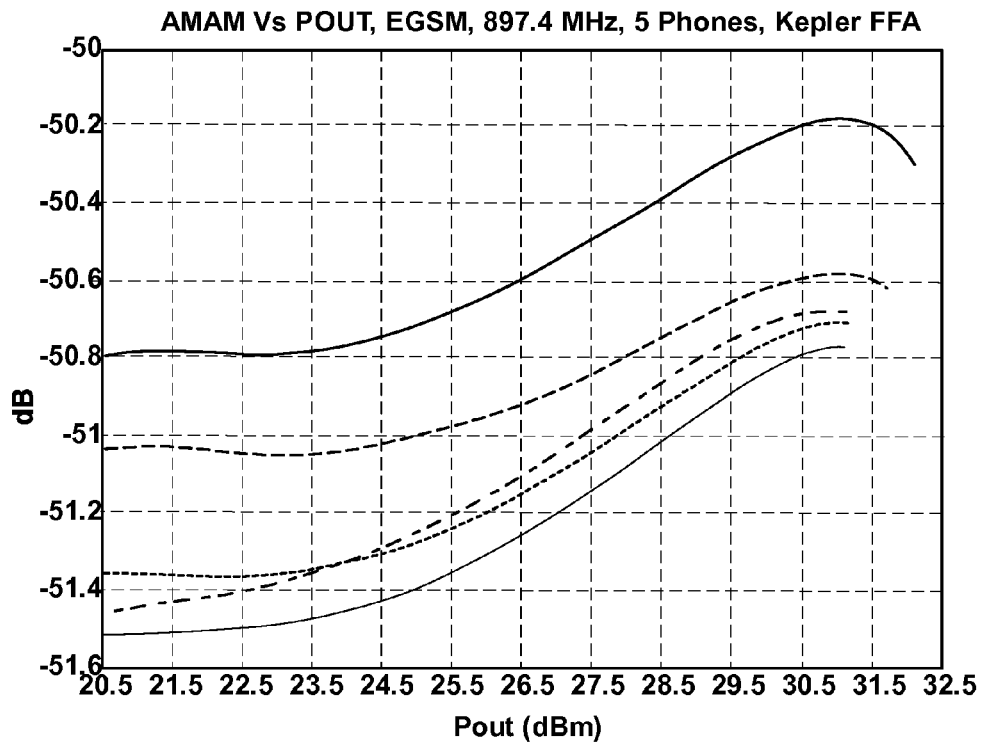
FIG. 4 depicts the generic AMAM vs POUT curves according to an embodiment.

FIG. 4 illustrates a series of AMAM curves plotted as a function of POUT for five mobile devices. Generating the AMAM curve proceeds as described below. The digital pre-distortion (DPD) AMAM non-volatile (NV) memory data is binned, or collected. There is one generic DPD curve for each RGI. Once that DPD AMAM non-volatile data has been binned, the actual baseband to antenna gain is derived from the AMAM NV stored item.

The next step provides that the AMAM curve with the highest $POUT_{AMAM}$ is identified. This mobile device will provide the reference curve $AMAM_{REF}$. The $AMAM_{REF}$ curve may be normalized to 0 dB at peak POUT for additional clarity, but this is not required. Once the AMAM curve with the highest POUT has been identified the remaining AMAM curves are aligned to the $AMAM_{REF}$ curve at the point of peak POUT.

Figure 5:
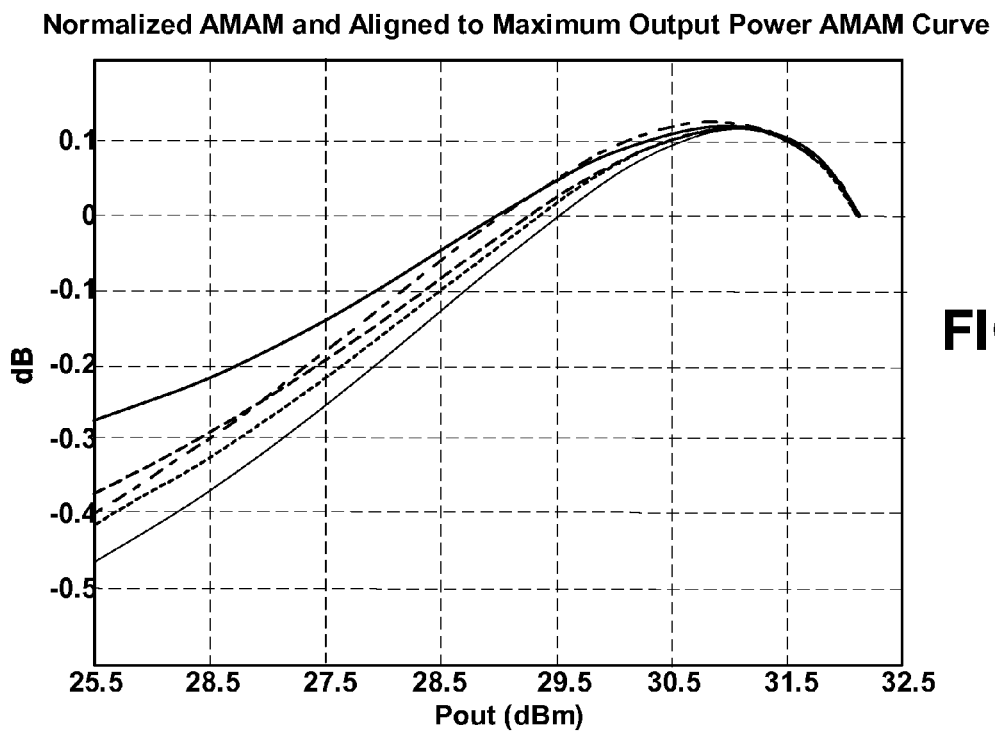
FIG. 5 shows a normalized AMAM and a curve aligned to maximum output power AMAM curve according to an embodiment.

The aligned AMAM curves are then average from the lowest to highest available POUT. FIG. 5 shows the normalized AMAM and aligned to maximum output power AMAM curve.

Figure 6:
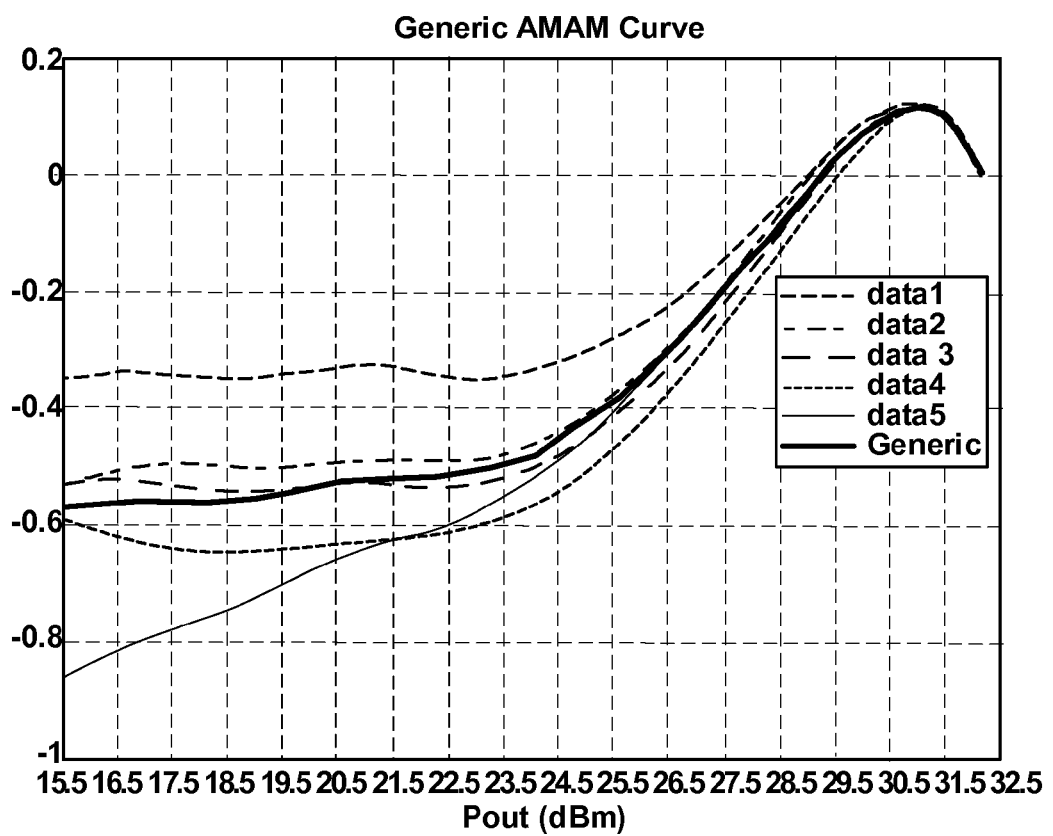
FIG. 6 illustrates a generic AMAM curve.

FIG. 6 shows the generic AMAM curve. This curve is generated as described above. The DPD AMPM NV data is binned by RGI. There is one generic DPD curve for each RGI. A corresponding $POUT_{AMPM}$ vector is derived for the DPD AMPM NV data. This derivation may be performed using any suitable method and may be varied. The AMPM curve with the highest $POUT_{AMPM}$ is selected. The curve is selected across all mobile units, similar to the selection for the AMAM curve described above. This selected curve becomes the reference curve.

The AMPM curves of the other mobile devices are aligned to the $AMPM_{REF}$ curve at their peak $POUT_{AMPM}$ value. The aligned AMPM curves are then averaged from lowest to highest available $POUT_{AMPM}$.

Figure 7:
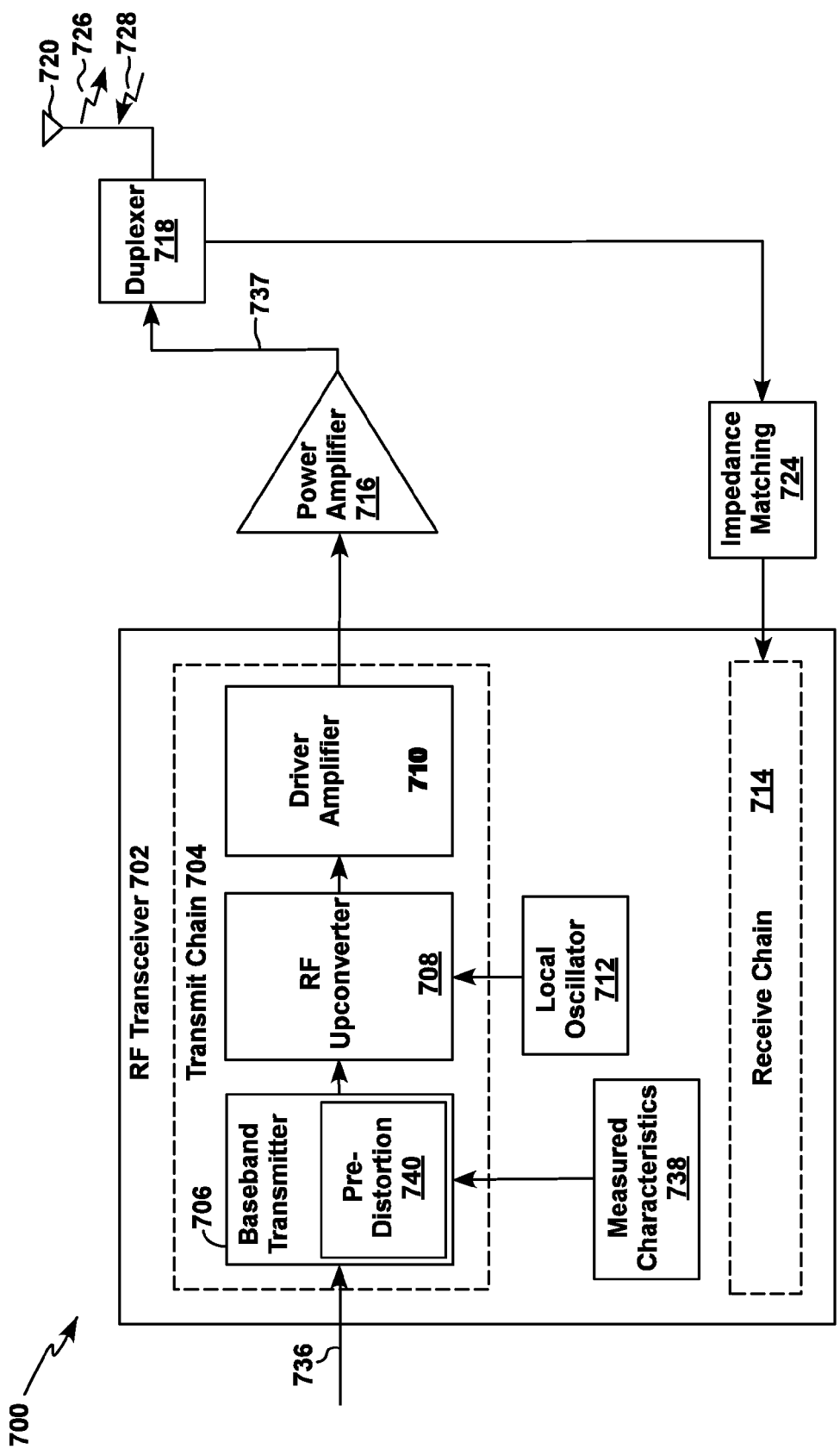
FIG. 7 is a block diagram illustrating one example of a system capable of transmitting after a test period to calibrate a power amplifier, according to embodiments of the disclosure.

FIG. 7 is a block diagram depicting one example of a transmitting system 700 during normal operation. The system 700 may include an RF transceiver 702 for transmitting outgoing signals 726 and receiving incoming signals 728 via an antenna 720. The RF transceiver 702 includes a receive chain 714 that receives the incoming signals 728. For example, the incoming signals 728 may be received by the antenna 720 and processed by duplexer 718. An impedance matching module 724 may match the impedance of the incoming signals 728. The receive chain 714 may further process the incoming signal 728.

A transmit signal 736 may be processed by the transmit chain 704 before being transmitted as an outgoing signal 726. The transmit signal may be input to a baseband transmitter 706 which is part of the transmit chain 704. Pre-distortion techniques may be applied to the transmit signal 736 at the baseband transmitter 706. The pre-distortion techniques may be applied to the transmit signal 736. The pre-distortion may cancel or otherwise compensate for distortion that is added to the signal at a PA 716. The pre-distortion techniques may be determined based on the measured AMAM/AMPM characteristics that were characterized as described above as part of the testing procedure of a transmitter in system 700.

After the signal is processed by the baseband transmitter 706, it may be upconverted to a higher frequency signal by an RF upconverter 708. The upconverter 708 may be controlled by a local oscillator 712. A driver amplifier 710 may amplify the upconverted signal. In addition, the PA 716 may further amplify the signal. Amplification of the signal by the PA 716 may distort the signal. the pre-distortion previously applied to the signal may cancel or otherwise compensate for the distortion added at the PA 716. An amplified signal 737 may be processed by the duplexer 718 and transmitted as a transmit signal 726 to a receiving device via antenna 720.

FIG. 8 illustrates various components that may be utilized in a wireless device 808. The wireless device 808 is an example of a device that may be used with the various systems and methods described herein. The wireless device 808 may be a mobile station 108, a mobile telecommunications device, cellular telephone, handset, personal digital assistant (PDA), etc.

The wireless device 808 may includes a processor 802 which controls operation of the wireless device 808. The processor 802 may also be referred to as a central processing unit (CPU). Memory 804, which may include both read-only memory (ROM) and random access memory (RAM) provides instructions and data to the processor 802. A portion of the memory 804 may also include non-volatile random access memory (NVRAM). The processor 802 typically performs logical and arithmetic operations based on program instructions stored within the memory 804. The instructions in the memory 804 may be executable to implement the methods described herein.

The wireless device 808 may also include a housing 822 that may include a transmitter 810 and a receiver 812 to allow transmission and reception of data between the wireless device 808 and a remote location. The transmitter 810 and receiver 812 may be combined into a transceiver 820. An antenna 818 may be attached to the housing 822 and electrically coupled to the transceiver 820. The wireless device 808 may also include (not shown) multiple transmitters, multiple receivers, multiple transceivers, and/or multiple antennas.

The wireless device 808 may also include a signal detector 806 that may be used to detect and quantify the level of signals received by the transceiver 820. The signal detector 806 may detect such signals as total energy, pilot energy per pseudonoise (PN) chips, power spectral density, and other signals. The wireless device 808 may also include a digital signal processor (DSP) 816 for use in processing signals.

The various components of the wireless device 808 may be coupled together by a bus system 826 which may include a power bus, a control signal bus, and a status signal bus in addition to a data bus. However, for the sake of clarity, the various buses are illustrated in FIG. 8 as the bus system 826.

FIG. 9 is a block diagram of a base station 908 in accordance with one example of the disclosed systems and methods. The base station 908 is an example of a device that may be used with the various systems and methods described herein. Examples of different implementations of a base station 908 include, but are not limited to, an evolved NodeB (eNB), a base station controller, a base station transceiver an access router, etc. The base station 908 includes a transceiver 920 that includes a transmitter 910 and a receiver 912. The transceiver 920 may be coupled to an antenna 918. The base station 908 further includes a digital signal processor (DSP) 914, a general purpose processor 902, memory 904, and a communication interface 906. The various components of the base station 908 may be included within a housing 922.

The processor 902 may control operation of the base station 908. The processor 902 may also be referred to as a CPU. The memory 904, which may include both read-only memory (ROM) and random access memory (RAM), provides instructions and data to the processor 902. A portion of the memory 914 may also include non-volatile random access memory (NVRAM). The memory 904 may include any electronic component capable of storing electronic information, and may be embodied as ROM, RAM, magnetic disk storage media, optical storage media, flash memory, on-board memory included with the processor 902, EPROM memory, EEPROM memory, registers, a hard disk, a removable disk, a CD-ROM etc. The memory 904 may store program instructions and other types of data. The program instructions may be executed by the processor 902 to implement some or all of the methods disclosed herein.

In accordance with the disclosed systems and methods, the antenna 918 may receive reverse link signals that have been transmitted from a nearby wireless device 908. The antenna 918 provides these received signals to the transceiver 920 which filters and amplifies the signals. The signals are provided from the transceiver 920 to the DSP 914 and to the general purpose processor 902 for demodulation, decoding, further filtering, etc.

The various components of the base station 908 are coupled together by a bus system 926 which may include a power bus, a control signal bus, and status signal bus in addition to a data bus. However, for the sake of clarity, the various buses are illustrated in FIG. 9 as the bus system 926.

It is understood that the specific order or hierarchy of steps in the processes disclosed is an illustration of exemplary approaches. Based upon design preferences, it is understood that the specific order or hierarchy of steps in the processes may be rearranged. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A method for characterized pre-distortion calibration, comprising:
   selecting a number of power amplifiers for characterizing, wherein the number of power amplifiers selected is a subset of a group of power amplifiers;
   characterizing the selected number of power amplifiers; and
   calibrating the group of power amplifiers based on the characterization of the selected number of power amplifiers.

2. The method of claim 1, wherein characterization further comprises:
   characterizing pre-distortion amplitude modulation to amplitude modulation curves across multiple parts;
   selecting a digital to analog converter (DAC) value having a relationship to a maximum DAC value for all bands a power amplifier operates on; and
   storing the selected DAC value.

3. The method of claim 1, wherein the calibration further comprises:
   sweeping an RF gain index over a range;
   defining an amplitude modulation to amplitude modulation (AMAM) curve for each tested power amplifier; and
   averaging the AMAM curve across the tested power amplifier.

4. The method of claim 1, wherein the calibration further comprises:
   sweeping an RF gain index over a range;
   defining an amplitude modulation to phase modulation (AMPM) curve for each tested power amplifier; and
   averaging the AMPM curve across the tested power amplifiers.

5. The method of claim 1, wherein the calibration comprises calibrating each power amplifier using an amplitude modulation to amplitude modulation (AMAM) averaged curve and an amplitude modulation to phase modulation (AMPM) averaged curve.

6. The method of claim 1, wherein each power amplifiers of the group of power amplifiers is measured on at least three channels per band.

7. An apparatus for characterized pre-distortion calibration, comprising:
   means for selecting a number of power amplifiers for characterizing, wherein the number of power amplifiers selected is a subset of a group of power amplifiers;
   means for characterizing the selected number of power amplifiers; and
   means for calibrating the group of power amplifiers based on the characterization of the selected number of power amplifiers.

8. The apparatus of claim 7, wherein the apparatus further comprises:
   means for characterizing, wherein the means for characterizing comprises:
      means for characterizing pre-distortion amplitude modulation to amplitude modulation curves across multiple parts;
      means for selecting a digital amplifier calibration (DAC) value having a relationship to a maximum DAC value for all bands a power amplifier operates on; and
      means for storing the selected DAC value.

9. The apparatus of claim 7, wherein the means for calibration further comprises:
   means for sweeping an RF gain index over a range;
   means for defining an amplitude modulation to amplitude modulation (AMAM) curve for each tested power amplifier; and
   means for averaging the AMAM curve across the tested power amplifiers.

10. The apparatus of claim 7, wherein the means for calibration further comprises:
    means for sweeping an RF gain index over a range;
    means for defining an amplitude modulation to amplitude modulation (AMAM) curve for each tested power amplifier; and
    means for averaging the AMAM curve across the tested power amplifier.

11. The apparatus of claim 7, wherein the means for calibration comprises means for calibrating each power amplifier using an amplitude modulation to amplitude modulation (AMAM) averaged curve and an amplitude modulation to phase modulation (AMPM) averaged curve.

12. A computer-readable non-transitory storage medium, containing instructions, which when executed cause a processor to perform the steps of:
    selecting a number of power amplifiers for characterizing, wherein the number of power amplifiers selected is a subset of a group of power amplifiers;
    characterizing the selected number of power amplifiers; and
    calibrating the group of power amplifiers based on the characterization of the selected number of power amplifiers.

13. The computer-readable non-transitory storage medium of claim 12, further comprising instructions for characterization that cause a processor to perform the steps of:
    characterizing pre-distortion amplitude modulation to amplitude modulation curves across multiple parts;
    selecting a digital amplifier calibration (DAC) value having a relationship to a maximum DAC value for all bands a device operates on; and
    storing the selected DAC value.

14. The computer-readable non-transitory storage medium of claim 12, further comprising instructions for calibration further comprising:
    sweeping an RF gain index over a range;
    defining an amplitude modulation to amplitude modulation (AMAM) curve for each tested power amplifier; and
    averaging the AMAM curve across the tested power amplifier.

15. The computer-readable non-transitory storage medium of claim 12, further comprising instructions for:
    sweeping an RF gain index over a range;
    defining an amplitude modulation to phase modulation (AMPM) curve for each tested power amplifier; and
    averaging the AMPM curve across the tested power amplifier.

16. The computer-readable non-transitory storage medium of claim 12, further comprising instructions for calibration that the calibration comprises calibrating each power amplifier using an amplitude modulation to amplitude modulation (AMAM) averaged curve and an amplitude modulation to phase modulation (AMPM) averaged curve.

* * * * *